United States Patent [19]

Terashima

[11] Patent Number: 5,194,394
[45] Date of Patent: Mar. 16, 1993

[54] THYRISTOR AND METHOD OF MANUFACTURING THE SAME

[75] Inventor: Tomohide Terashima, Fukuoka, Japan

[73] Assignee: Mitsubishi Denki Kabushiki Kaisha, Tokyo, Japan

[21] Appl. No.: 828,204

[22] Filed: Jan. 30, 1992

Related U.S. Application Data

[62] Division of Ser. No. 573,776, Aug. 28, 1990, Pat. No. 5,091,766.

[30] Foreign Application Priority Data

Oct. 23, 1989 [JP] Japan .................... 1-275412

[51] Int. Cl.⁵ .......................................... H01L 21/332
[52] U.S. Cl. ........................................ 437/6; 437/149; 148/DIG. 126
[58] Field of Search ........................ 437/6, 149; 148/DIG. 126; 357/23.4

[56] References Cited

U.S. PATENT DOCUMENTS

| | | |
|---|---|---|
| 4,644,637 | 2/1987 | Temple . |
| 4,760,431 | 7/1988 | Nakagawa et al. ............... 357/234 |
| 4,847,671 | 7/1989 | Pattanayaki et al. ............ 357/38 |
| 4,857,977 | 8/1989 | Temple .............................. 357/23.4 |
| 4,912,541 | 3/1990 | Balig et al. ....................... 357/38 |
| 4,963,972 | 10/1990 | Shinohe et al. .................. 357/38 |

FOREIGN PATENT DOCUMENTS

| | | |
|---|---|---|
| 0068945 | 1/1983 | European Pat. Off. ........ 357/23.4 |
| 0219995 | 4/1987 | European Pat. Off. . |
| 0280535 | 8/1988 | European Pat. Off. ........ 357/23.4 |
| 3711033 | 10/1987 | Fed. Rep. of Germany .... 357/23.4 |
| 61-198781 | 9/1986 | Japan ............................... 357/23.4 |
| 62-76557 | 4/1987 | Japan ............................... 357/23.4 |
| 63-53972 | 3/1988 | Japan . |
| 63-209169 | 8/1988 | Japan ............................... 357/23.4 |

OTHER PUBLICATIONS

Nakagawa et al., "Safe Operating Area . . . ", IEEE Trans. Elec. Dev. vol. ED-34, No. 2, Feb. 1987, pp. 351-354.

IEEE Transactions on Electron Devices, vol. ED-34, No. 2, Feb. 1987, "Safe Operating Area for 1200-V Nonlatchup Bipolar-Mode Mosfet's" by Akio Nakagawa, Member, IEEE; Yoshiro Yamaguchi; Kiminori Watanabe; and Hiromichi Ohoshi, Member, IEEE.

*Primary Examiner*—T. N. Quach
*Attorney, Agent, or Firm*—Oblon, Spivak, McClelland, Maier & Neustadt

[57] ABSTRACT

A thyristor of the present invention turns on by applying a specified voltage to a first control electrode and turns off by applying a specified voltage to a second control electrode. These first and second control electrodes are independent of each other, so that the turning-on and turning-off conditions can be determined independently. When a transistor having the second control electrode is turned on by applying the specified voltage to the second control electrode until just before the turning-on, a first main electrode and a first semiconductor region can be electrically connected, so that the back gate potential of the transistor having the first control electrode can be fixed at the potential of the first main electrode.

4 Claims, 7 Drawing Sheets

THYRISTOR AND METHOD OF MANUFACTURING THE SAME

This is a division of application Ser. No. 07/573,776, filed on Aug. 28, 1990 U.S. Pat. No. 5,091,766.

BACKGROUND OF THE INVENTION

1. Field of the Invention

The present invention relates to a thyristor which serves as a switch by applying a specified voltage to a plurality of insulating gates and to a method of manufacturing the same.

2. Description of the Prior Art

Figure 1:
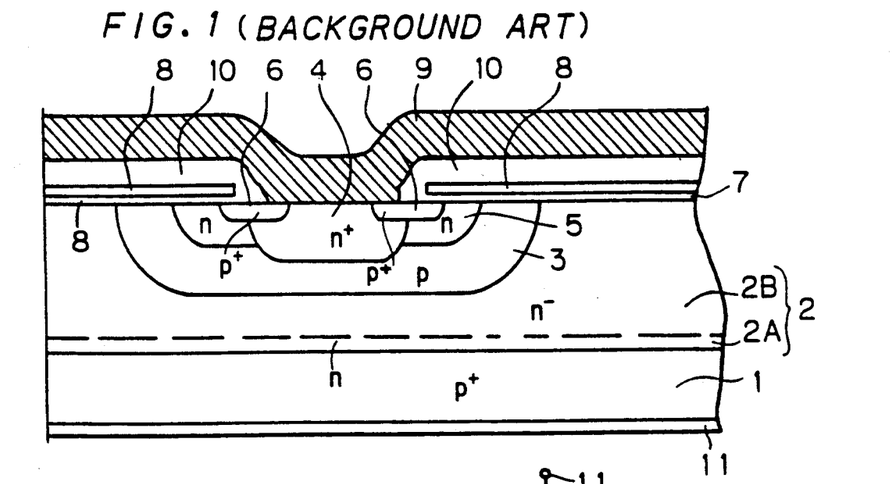
FIG. 1 is a sectional view showing a conventional MCT.

FIG. 1 is a sectional view showing a conventional MCT (MOS Controlled Thyristor). In FIG. 1, a p+ substrate 1 has an n epitaxial layer 2A formed on one of its major surfaces, and an n− epitaxial layer 2B is formed on the n epitaxial layer 2A. A p well region 3 is formed in a part of an upper portion of the n− epitaxial layer 2B by selectively diffusing p type impurity. An n+ diffused region 4 is formed at the center region in the surface of the p well region 3 by selectively diffusing n type impurity of high concentration, and an n diffused region 5 is formed contiguous to the n+ diffused region 4 by diffusing n type impurity in the outer peripheral portion of the n+ diffused region 4. A p+ diffused region 6 is formed in the surface region lying across the n+ diffused region 4 and the n diffused region 5 by selectively diffusing p type impurity of high concentration around the boundary portion of the surface of the n+ diffused region 4 and the n diffused region 5.

A gate oxide film 7 is formed lying over the n− epitaxial layer 2B, the p well region 3, the n diffused region 5 and a part of the p+ diffused region 6, and a gate electrode 8 made of polysilicon is formed on the gate oxide film 7. Further, a cathode electrode 9 made of metal such as aluminum is provided on the n+ diffused region 4 and a part of the p+ diffused region 6 in contact with them, and the cathode electrode 9 and the gate electrode 8 are insulated from each other by a layer oxide film 10 provided therebetween. On the other hand, an anode electrode 11 made of metal is formed on the bottom surface of the p+ substrate 1.

Figure 2:
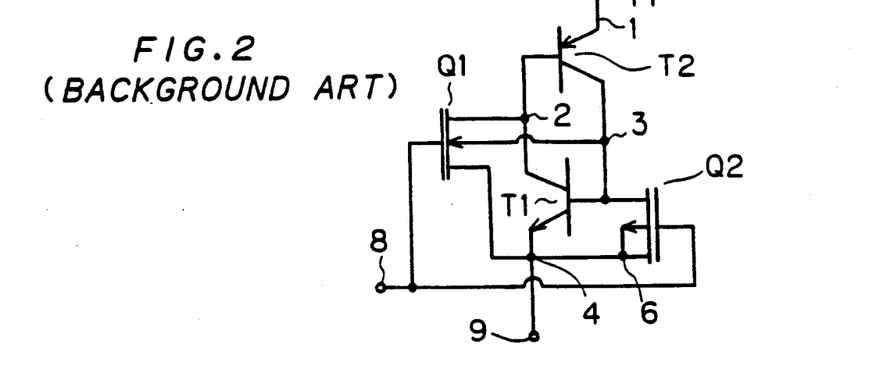
FIG. 2 is an equivalent circuit diagram of the conventional MCT.

FIG. 2 is a diagram showing an equivalent circuit of the MCT shown in FIG. 1. As shown in FIG. 2, the n+ epitaxial layer 2A and the n− epitaxial layer 2B (these two layers are generally referred to as "n base layer 2" hereinafter, as required), the p+ diffused region 3 and the n+ diffused region 4 compose an npn transistor T1, serving as a collector, a base and an emitter thereof, respectively. The p+ substrate 1, the n base layer 2 and the p+ diffused region 3 compose a pnp transistor T2, serving as an emitter, a base and a collector thereof, respectively. The n− epitaxial layer 2B, the p well region 3 and the n diffused region 5 compose an n MOS transistor Q1 where the gate electrode 8 serves as a gate and the surface of the p well region 3 between the n− epitaxial layer 2B and the n diffused region 5 serves as a channel region, respectively. The p well region 3, the n diffused region 5 and the p+ diffused region 6 compose a p MOS transistor Q2 where the gate electrode 8 serves as a gate and the surface of the n diffused region 5 serves as a channel region, respectively.

Figure 3:
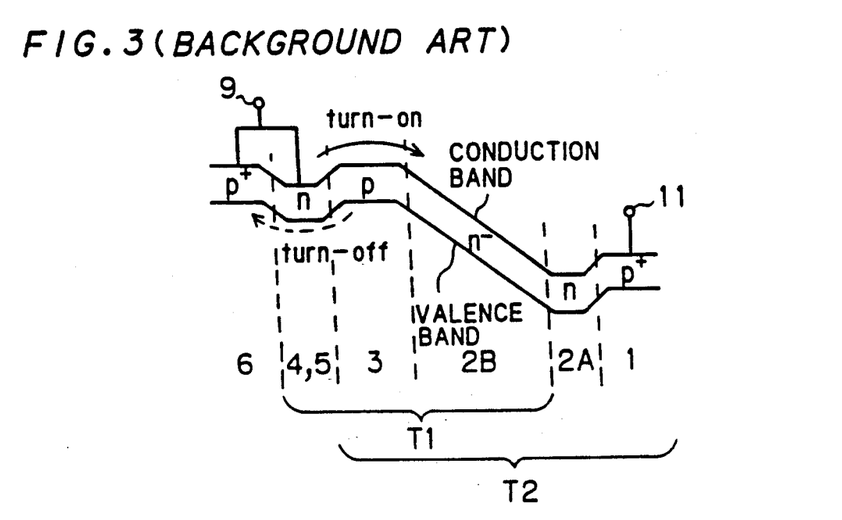
FIG. 3 is a energy band diagram showing the operation of the conventional MCT.

With the aforementioned constitution, as shown in a energy band diagram of FIG. 3, the MCT shown in FIG. 1 turns on by keeping the n MOS transistor Q1 turned on for a specified period of time with its anode 11 being higher in potential than its cathode 9. When positive voltage is applied to the gate electrode 8, the n MOS transistor Q1 turns on to inject electrons to the base of the transistor T2 through the channel formed close to the surface of the p well region 3 just under the gate electrode 8. Then, the transistor T2 turns on, and the amplification of the transistor causes a large amount of holes to flow across its collector. Since the collector of the transistor T2 is connected to a base of the transistor T1, the holes flow to the base of the transistor T1 to turn the transistor T1 on. The amplification of the transistor causes a large amount of electrons to flow to its collector. Since the collector of the transistor T1 is connected to the base of the transistor T2, the transistor T2 is increasingly turned on. Thus, once the n MOS transistor Q1 turns on, a positive feedback loop is formed between the transistors T1, T2. Hence, even when the n MOS transistor Q1 is turned off, current continuously flows between the transistors T1, T2 because of the thyristor operation obtained by the amplification of each of the transistors.

Meanwhile, the MCT turns off by turning the p MOS transistor Q2 on for a specified period of time. When negative voltage is applied to the gate electrode 8, the p MOS transistor Q2 turns on to cause holes to be injected to the base of the transistor T1 to flow through the channel formed in the surface of the n diffused region 5 just under the gate electrode 8 via the p+ diffused region 6 to the cathode electrode 9. As a result, the transistor T1 turns off, and then the transistor T2 turns off to stop the thyristor operation.

Thus, the MCT is turned on or off by applying positive voltage or negative voltage to the gate electrode 8 common to the MOS transistors Q1, Q2.

The conventional MCT has a constitution as stated above, and positive voltage or negative voltage is applied to the single gate electrode 8 to turn on or off either of the two MOS transistors Q1, Q2 so as to turn on or off the MCT.

However, since the two MOS transistors Q1, Q2 are formed in adjacent to each other, the p well region 3 serving as a channel of the n MOS transistor Q1 and the n diffused region 5 serving as a channel of the p MOS transistor Q2 are formed inevitably in adjacent to each other. The threshold voltage $V_{th}$ to turn the respective MOS transistors Q1, Q2 on is influenced by the impurity concentration, the width, etc. of each of the adjacent channel regions. Consequently, there arises the problem that it is difficult to set the individual threshold voltages $V_{th}$ of the MOS transistors Q1, Q2.

Although turning on of the n MOS transistor Q1 results in the MCT turning on, simultaneously electrons pass through the surface portion of the p well region 3 serving as the channel region of the n MOS transistor Q1 via the n diffused region 5 having low impurity concentration. On the other hand, although turning on of the p MOS transistor Q2 results in the MCT turning off, simultaneously holes pass through the surface portion of the n diffused region 5 serving as the channel region of the p MOS transistor Q2 via the p well region 3 having low impurity concentration. Thus, since electrons (holes) must pass through the region of relatively high resistance when the MCT is turned on or off, current density accordingly becomes small. Consequently, there arises the problem that the period of time of the MCT's turning on or off becomes longer than is necessary and the maximum current density to be turned off becomes small.

The p well region 3 in the surface of which the channel region of the n MOS transistor Q1 is formed has an unstable back gate voltage in the floating condition when the MCT is turned on. As a result, there arises the problem that the malfunction is easily caused due to the charge-up of the gate when the MCT works with high frequency.

Triple diffusion is necessary to the conventional MCT having a constitution as shown in FIG. 1. This causes the problem that the manufacturing process is complicated.

SUMMARY OF THE INVENTION

A thyristor according to the present invention comprises a first semiconductor layer of a first conductivity type, having first and second major surfaces, a second semiconductor layer of a second conductivity type, formed on the first major surface of the first semiconductor layer, a first semiconductor region of the first conductivity type, selectively formed on a surface of the second semiconductor layer, second and third semiconductor regions of the second conductivity type, selectively formed on a surface of the first semiconductor region separately from each other, a first insulating film formed on the surface of the first semiconductor region between the second semiconductor layer and the second semiconductor region, a second insulating film formed on the surface of the first semiconductor region between the second semiconductor region and the third semiconductor region, first and second control electrodes formed on the first and second insulating films independent of each other, respectively, a first main electrode formed on the second semiconductor region, a conductive layer formed on the first semiconductor region and the third semiconductor region, and a second main electrode formed on the second major surface of the first semiconductor layer.

A method of manufacturing a thyristor according to the present invention comprises the steps of preparing a first semiconductor layer of a first conductivity type, having first and second major surfaces, forming a second semiconductor layer of a second conductivity type on the first major surface of the first semiconductor layer, selectively forming a first semiconductor region of the first conductivity type on a surface of the second semiconductor layer, selectively forming second and third semiconductor regions of the second conductivity type on a surface of the first semiconductor region separately from each other, forming a first insulating film on the surface of the first semiconductor region between the second semiconductor layer and the second semiconductor region, forming a second insulating film on the surface of the first semiconductor region between the second semiconductor region and the third semiconductor region, forming first and second control electrodes on the first and second insulating films, respectively, forming a first main electrode on the second semiconductor region, forming a conductive layer on the first semiconductor region and the third semiconductor region, and forming a second main electrode on the second major surface of the first semiconductor layer.

According to the present invention, a thyristor is composed of first and second semiconductor layers and first and second semiconductor regions. A specified voltage is applied to a first control electrode to reverse the conductivity type of the surface of the first semiconductor region just under the first control electrode. As a result, carriers are applied to the second semiconductor layer from a first main electrode through the second semiconductor region and the surface of the first semiconductor region just under the first control electrode to turn the thyristor on.

On the other hand, a specified voltage is applied to a second control electrode independent of the first control electrode to reverse the conductivity type of the surface of the first semiconductor region just under the second control electrode. As a result, the first and second semiconductor regions are short-circuited through a metal layer, a third semiconductor region and the surface of the first semiconductor region just under the second control electrode to turn the thyristor off.

Accordingly, it is an object of the present invention to provide a thyristor capable of independently determining the turning on and off conditions and having a high stability and an improved switching speed, using a relatively simple manufacturing method.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 4:
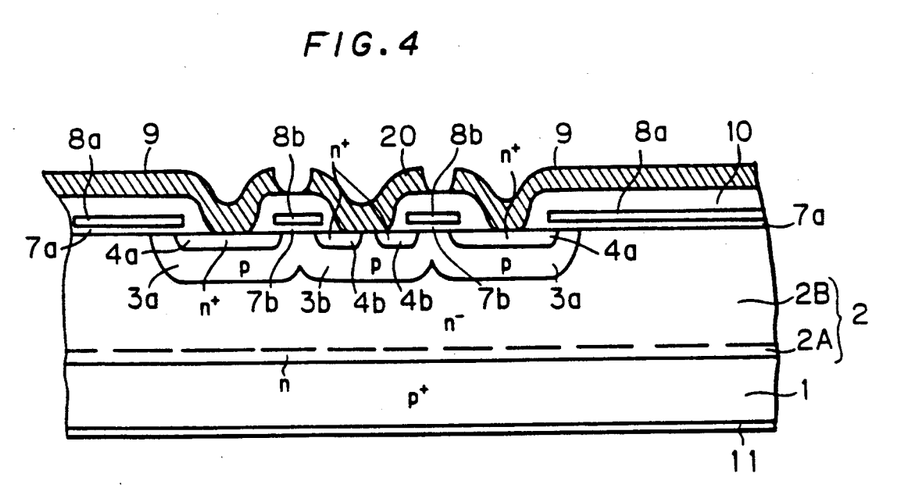
FIG. 4 is a sectional view showing a first embodiment of an MCT of the present invention.

FIG. 4 is a sectional view showing a first embodiment of an MCT according to the present invention. As shown in FIG. 4, an n epitaxial layer 2A is formed on a major surface of a p+ substrate 1, and an n− epitaxial layer 2B is formed on the n epitaxial layer 2A. P type impurity is selectively diffused partially in the surface of the n− epitaxial layer 2B to form p well regions 3a, 3b. N type impurity of high concentration is diffused at the center region of the surface of the p well region 3a to form an n+ diffused region 4a, and n type impurity of high concentration is selectively diffused partially in the surface of the p well region 3b to form the n+ diffused region 4b.

A gate oxide film 7a is formed lying over the n⁻ epitaxial layer 2B, the p well region 3a and a part of the n+ diffused region 4a. On the other hand, a gate oxide film 7b is formed lying over a part of the n+ diffused region 4a, the p well regions 3a, 3b and a part of the n+ diffused region 4b. Gate electrodes 8a, 8b are formed on the gate oxide films 7a, 7b, respectively. A cathode electrode 9 made of metal such as aluminum is formed on the n+ diffused region 4a, and a metal layer 20 is formed on the n+ diffused region 4b and the p well region 3b. The cathode electrode 9 and the metal layer 20 never come in contact with each other, and they are insulated from each other by the gate electrodes 8a, 8b and a layer insulating film 10 intervened therebetween.

Figure 5:
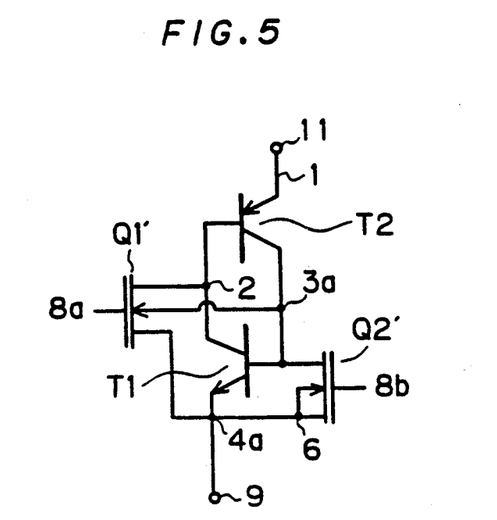
FIG. 5 is an equivalent circuit diagram of the MCT of the first embodiment.

FIG. 5 is an equivalent circuit diagram of the MCT of the first embodiment shown in FIG. 4. As shown in FIG. 4, the n epitaxial layer 2A and the n⁻ epitaxial layer 2B (these are generally referred to as "n base layer 2" hereinafter, as required), the p well region 3a and the n+ diffused region 4a compose an npn transistor T1, serving as a collector, a base and an emitter thereof, respectively. The p+ substrate 1, the n base layer 2 and the p well region 3a compose a pnp transistor T2, serving as an emitter, a base and a collector thereof, respectively. The n⁻ epitaxial layer 2B, the p well region 3a and the n+ diffused region 4a compose an n MOS transistor Q1' where the gate electrode 8a serves as its gate and the surface of the p well region 3a between the n⁻ epitaxial layer 2B and the n+ diffused region 4a serves as its channel region. The n+ diffused region 4b, the n+ diffused region 4a and the p well regions 3a, 3b between the n+ diffused regions 4a, 4b compose an n MOS transistor Q2' where the gate electrode 8b serves as its gate and the surface of the p well regions 3a, 3b between the n+ diffused regions 4a, 4b serves as its channel region.

Figure 6:
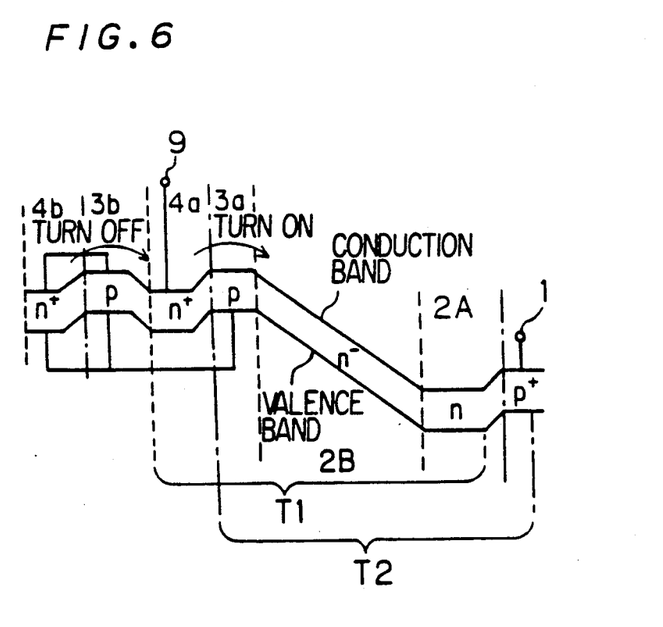
FIG. 6 is a energy band diagram showing the operation of the MCT of the first embodiment.

With the above mentioned constitution, as shown in a energy band diagram of FIG. 6, the MCT turns on by keeping the n MOS transistor Q1' turned on for a specified period of time with its anode 11 being higher in potential than its cathode 9. When positive voltage is applied to the gate electrode 8a, the n MOS transistor Q1' turns on to inject electrons to the base of the transistor T2 through the channel formed close to the surface of the p well region 3a just under the gate electrode 8a. Then, the transistor T2 turns on, and the amplification of the transistor causes a large amount of holes to flow across its collector. Since the collector of the transistor T2 is connected to a base of the transistor T1, the holes flow to the base of the transistor T1 to turn the transistor T1 on. The amplification of the transistor T1 cause a large amount of electrons to flow to its collector. Since the collector of the transistor T1 is connected to the base of the transistor T2, the transistor T2 is increasingly turned on. Thus, once the MCT turns on, a positive feedback loop is formed between the transistors T1, T2. Hence, even when the n MOS transistor Q1' is turned off, current continuously flows between the transistors T1, T2 because of the thyristor operation.

Meanwhile, the MCT turns off by keeping an n MOS transistor Q2' turned-on for a specified period of time. When positive voltage is applied to the gate electrode 8b, the n MOS transistor Q2' turns on to form a channel in the surface of the p well regions 3a, 3b just under the gate electrode 8b. As the channel is formed, the p well region 3a and the n+ diffused region 4a are short-circuited through the p well region 3b, the metal layer 20, the n+ diffused region 4b and the above mentioned channel. As a result, the transistor T1 turns off and the thyristor operation is stopped, because there is almost no potential difference between the p well region 3a and the n+ diffused region 4a (the potential difference between the base and the emitter of the transistor T1).

Thus, the MCT of the first embodiment has a constitution where the turning-on MOS transistor Q1' and the turning-off MOS transistor Q2' are provided independent of each other but having the n+ diffused region 4a commonly used, so that the turning-on or -off of the transistors Q1', Q2' can be controlled independently. The threshold voltages $V_{th}$ of the transistors Q1', Q2' can be set independent of each other, and may also be set at the same level.

When the n MOS transistor Q2' is kept turned-on until just before the turning-on of the MCT, the potential of the p well region 3a (3b) which is the back gate potential of the n MOS transistor Q1' can be fixed at the potential of the cathode electrode 9 through the surface of the p well regions 3a, 3b just under the gate electrode 8b, the n+ diffused region 4b and the metal layer 20 and, therefore, the charge-up and the like caused in the back gate potential of the n MOS transistor Q1' can be prevented. As a result, the malfunction never occurs in the high frequency operation.

Since the n+ diffused regions 4a, 4b serving as the drain and the source of the n MOS transistors Q1', Q2' are high in concentration (i.e. low in resistance), the turning-on and the turning-off can be performed at high speed, and also the current density to be turned off can be large.

FIG. 7 is a sectional view illustrating a method of manufacturing the MCT of the first embodiment. The manufacturing method will be explained with reference to FIG. 7.

Figure 7A:
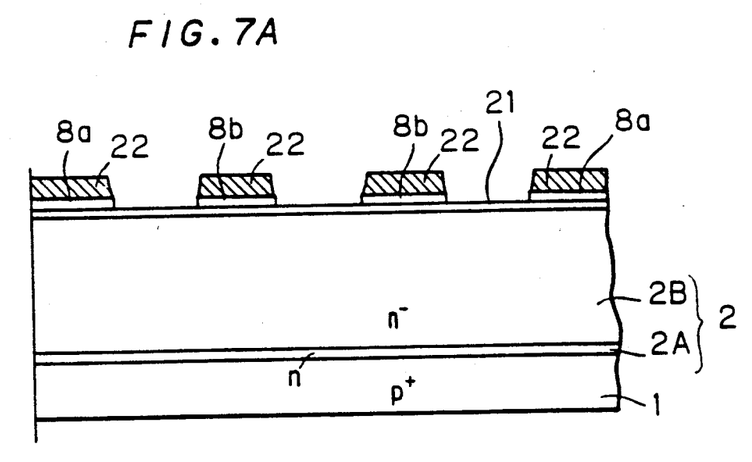
FIGS. 7A-7D are a sectional view illustrating a method of manufacturing the MCT of the first embodiment.

First, the n epitaxial layer 2A and the n⁻ epitaxial layer 2B are formed on the p+ collector layer 1 by means of epitaxial growth, and thereafter an oxide film 21 is formed over the entire surface of the n⁻ epitaxial layer 2B. After that, a polysilicon layer is deposited, and then a resist 22 is formed on the polysilicon layer. The resist 22 is patterned by means of photolithography, and the polysilicon layer is etched using the patterned resist 22 as a mask to form the gate electrodes 8a, 8b as shown in FIG. 7A.

Figure 7B:
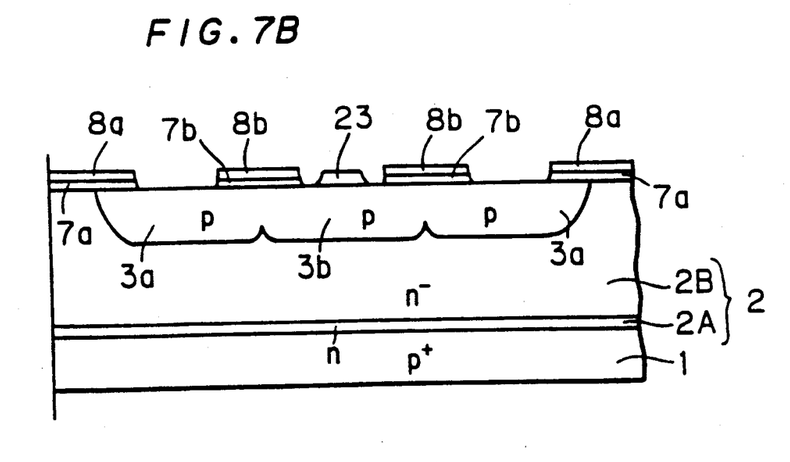

After the resist 22 is removed, boron is implanted using the gate electrodes 8a, 8b as masks, and then the annealing treatment is carried out to diffuse the implanted boron. Thus, the p well regions 3a, 3b are formed as shown in FIG. 7B. The oxide film 21 and the oxide film formed over the entire surface of the oxide film 21 on the annealing treatment are patterned by photolithography to form an oxide film 23 and gate oxide films 7a, 7b.

Figure 7C:
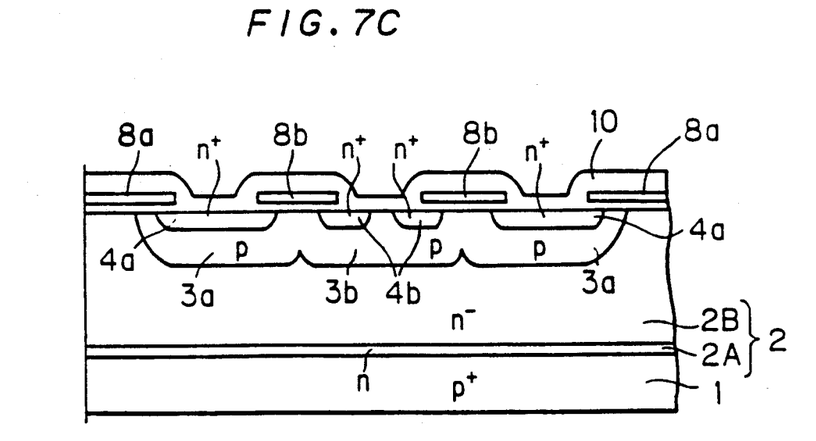

Further, phosphor is deposited using the oxide film 23 and the gate electrodes 8a, 8b as a mask. After that, the annealing treatment is performed to diffuse the implanted phosphor. Thus, the n+ diffused regions 4a, 4b are formed, and the entire surface is covered with the layer insulating film 10.

Figure 7D:
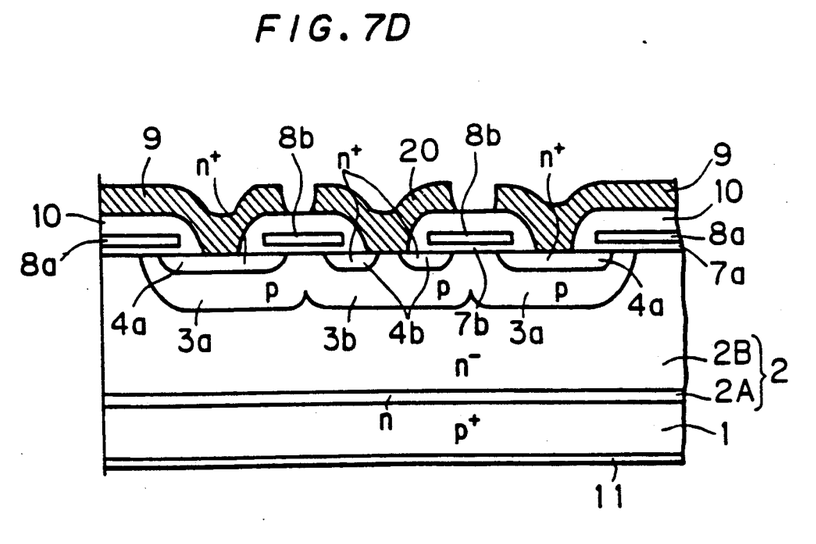

Then, after contact holes are formed in the layer insulating film 10 on the center portion of the n+ diffused region 4a, a part of the n+ diffused region 4b and the p well region 3b between the n+ diffused regions 4b, 4b by means of photolithography, an Al layer is deposited by Al-Si spattering. The Al layer is selectively etched to form the cathode electrode 9 and the metal layer 20 as shown in FIG. 7D. The anode electrode 11 is formed on the bottom surface of the p+ substrate 1 by means of vaporization.

This manufacturing method includes only two diffusing steps, and thus the manufacturing process is simplified.

In the first embodiment, the n MOS transistor Q2' is turned on, the p well region 3a and the n+ diffused region 4a are short-circuited through the p well region 3b, the metal layer 20, the n+ diffused region 4b and the surfaces (channels) of the p well regions 3a, 3b just under the gate electrode 8b, the difference in potential is eliminated between the p well region 3a and the n+ diffused region 4a, and the transistor T1 is turned off, so that the turning-off operation is performed. However, with the constitution shown in FIG. 4, a current path from the p well region 3a to the metal layer 20 is provided as a path extending through the p well region 3b under the n+ diffused region 4b to the metal layer 20. Since the p well region 3b is formed by diffusion, and the impurity concentration becomes lower (higher in resistance) in the depthwise direction, and therefore the resistance component between the p well region 3a and the metal layer 20 becomes larger. As a result, the potential difference which can not be ignored is caused between the p well region 3a and the n+ diffused region 4a. Possibly there arises the problem that even when the n MOS transistor Q2' is turned on, it is difficult to turn the transistor T1 off (the problem is referred to as "high resistance problem" hereinafter). To solve the high resistance problem, second to fourth embodiments are provided as described below.

Figure 8:
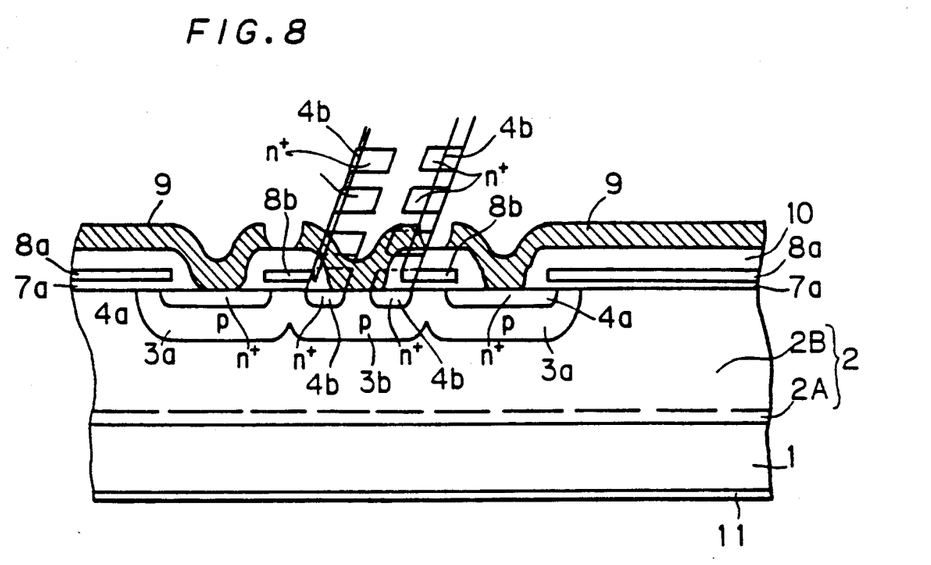
FIG. 8 is a perspective sectional view showing a second embodiment of the MCT according to the present invention.

FIG. 8 shows a perspective sectional view showing the MCT of the second embodiment of the present invention. As shown in FIG. 8, the n+ diffused region 4b is formed, dispersed in the surface portion of the p well region 3b. Other parts of the constitution are similar to corresponding parts of the first embodiment, and the explanation about them is omitted.

With this constitution, the current path from the p well region 3 to the metal layer 20 can be provided as a path which extends only through the surface of the p well region 3b having a relatively high concentration (low resistance), and at that rate the high resistance problem can be considerably eased.

The MCT made by the method of the second embodiment has a configuration of the n+ diffused region 4b alone varied from the MCT made by the method of the first embodiment shown in FIG. 7.

Figure 9:
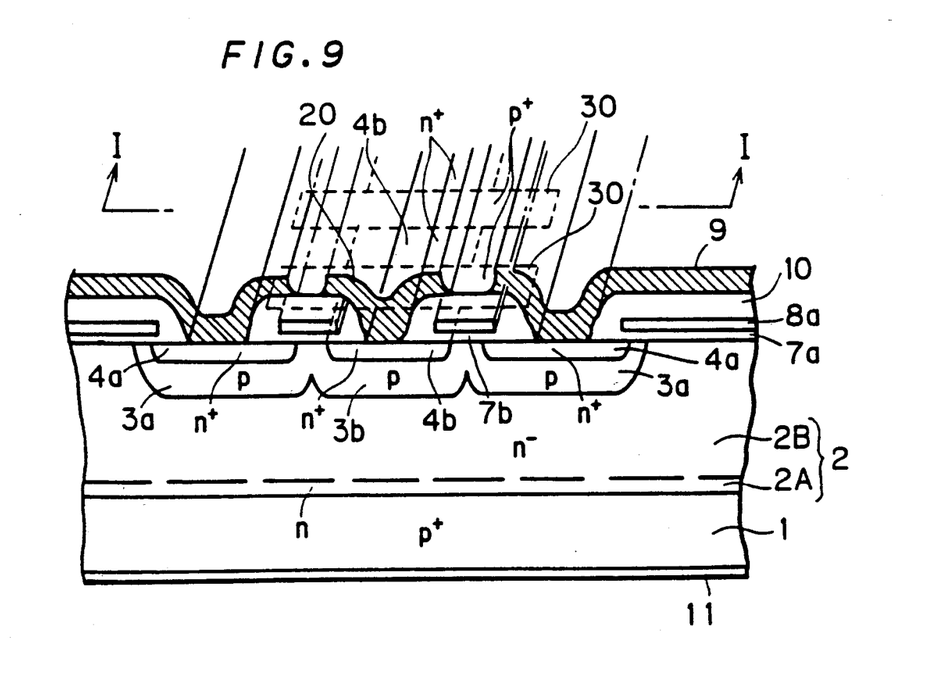
FIG. 9 is a perspective sectional view of a third embodiment of the MCT according to the present invention.
Figure 10:
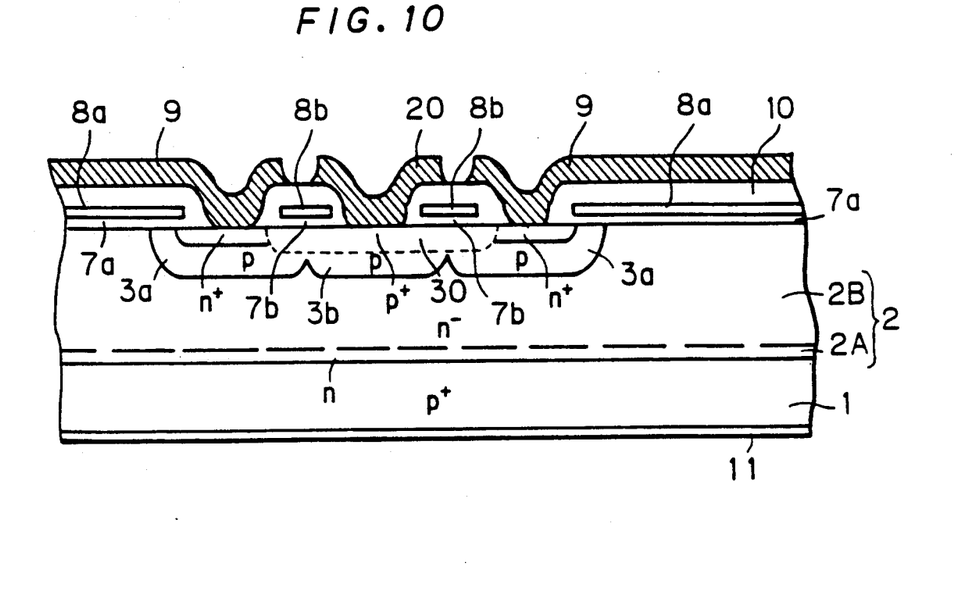
FIG. 10 is a sectional view taken along the line I—I of FIG. 9.

FIG. 9 is a perspective sectional view showing the MCT of the third embodiment according to the present invention. FIG. 10 is a sectional view taken along the line I—I of FIG. 9. As shown in these figures, the n+ diffused region 4b is formed, dispersed in the surface portion of the p well region 3b, and p type impurity of high concentration is diffused across the surface portion of the p well region 3b and a part of the surface of the p well region 3a to form a p+ diffused region 30. Other parts of the constitution are similar to corresponding parts of the first embodiment, and the explanation about them is omitted.

With this constitution, holes from the p well region 3a can flow to the metal layer 20 through the p+ diffused region 30 having low resistance, so that the aforementioned high resistance problem can be considerably improved.

The MCT of the third embodiment is made by an additional step and almost the same process steps as those shown in FIGS. 7A to 7D, that is, the p+ diffused region 30 is formed in the surface of the n− epitaxial layer 2B before the step shown in FIG. 7A.

Figure 11:
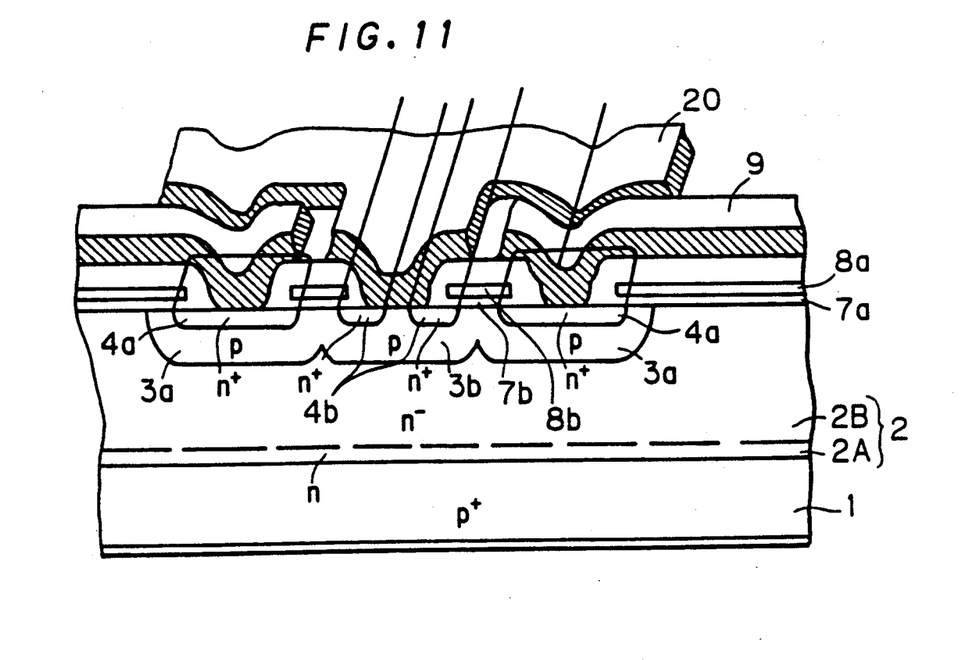
FIG. 11 is a perspective sectional view showing a fourth embodiment of the MCT according to the present invention.

FIG. 11 is a perspective sectional view showing the MCT of the fourth embodiment according to the present invention. As shown in FIG. 11, the n+ diffused region 4a is formed, or discretely in the surface portion of the p well region 3a, and the metal layer 20 extends over the p well region 3a on which no n+ diffused region 4a lies. Other parts of the constitution are similar to corresponding parts of the first embodiment, and the explanation about them is omitted.

With this constitution, holes from the p well region 3a can flow directly to the metal layer 20, so that the aforementioned high resistance problem can be considerably improved.

The MCT made by the manufacturing method of the fourth embodiment has only configurations of the n+ diffused region 4a and the metal layer 20 varied from the MCT made by the manufacturing method of the first embodiment shown in FIG. 7, and the process steps both the methods include are the same.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A method of manufacturing a thyristor, comprising the steps of:
    (a) preparing a first semiconductor layer of a first conductivity type, having first and second major surfaces;
    (b) forming a second semiconductor layer of a second conductivity type on said first major surface of said first semiconductor layer;
    (c) selectively forming a first semiconductor region of the first conductivity type on a surface of said second semiconductor layer;
    (d) selectively forming second and third semiconductor regions of the second conductivity type on a surface of said first semiconductor region separately from each other;
    (e) forming a first insulating film on the surface of said first semiconductor region between said second semiconductor layer and said second semiconductor region;
    (f) forming a second insulating film on the surface of said first semiconductor region between said second semiconductor region and said third semiconductor region;
    (g) forming first and second control electrodes on said first and second insulating films, respectively;
    (h) forming a first main electrode on said second semiconductor region;
    (i) forming a conductive layer on said first semiconductor region and said third semiconductor region; and
    (j) forming a second main electrode on said second major surface of said first semiconductor layer;
    wherein said second semiconductor region is composed of a plurality of regions discretely formed, and
    said conductive layer is formed on the surface of said first semiconductor region between said plurality of regions.

2. A method of manufacturing a thyristor in accordance with claim 1, wherein said third semiconductor region is composed of a plurality of regions discretely formed.

3. A method of manufacturing a thyristor in accordance with claim 2, further comprising the step of;
(k) forming a high impurity concentration region of the first conductivity type on the surface of said first semiconductor region;
said step (i) includes the step of forming said conductive layer on said first semiconductor region as well as said high impurity concentration region, and said third semiconductor region.

4. A method of manufacturing a thyristor in accordance with claim 1, wherein
said first conductivity type is a p type, and
said second conductivity type is an n type.

* * * * *